United States Patent [19]

Madan

[11] Patent Number: 5,539,612
[45] Date of Patent: Jul. 23, 1996

[54] INTERMEDIATE STRUCTURE FOR FORMING A STORAGE CAPACITOR

[75] Inventor: Sudhir K. Madan, Dallas, Tex.

[73] Assignee: Texas Instruments Incorporated, Dallas, Tex.

[21] Appl. No.: 288,515

[22] Filed: Aug. 10, 1994

Related U.S. Application Data

[63] Continuation of Ser. No. 941,484, Sep. 8, 1992, abandoned.

[51] Int. Cl.$^6$ ............................ H01G 4/005; H01G 4/06
[52] U.S. Cl. .................. 361/303; 361/321.4; 361/321.1; 257/304; 365/149
[58] Field of Search .................. 361/321.5, 301.5, 361/303, 311–313, 321.1, 321.2, 321.3, 321.4; 365/145, 149; 257/301, 303, 304, 306, 309

[56] References Cited

U.S. PATENT DOCUMENTS

| | | | |
|---|---|---|---|
| 4,009,424 | 2/1977 | Itoh | 365/311 X |
| 4,700,457 | 10/1987 | Matsukawa | 437/52 |
| 4,742,018 | 5/1988 | Kimura | 365/149 |
| 5,045,899 | 9/1991 | Arimoto | 257/301 |
| 5,047,817 | 9/1991 | Wakamiya et al. | 257/301 |
| 5,084,405 | 1/1992 | Fazan et al. | 437/52 |
| 5,126,916 | 6/1992 | Tseng | 361/313 |
| 5,158,905 | 10/1992 | Ahn | 437/52 |
| 5,164,337 | 11/1992 | Oawa et al. | 473/228 |
| 5,164,881 | 11/1992 | Ahn | 361/313 |
| 5,185,284 | 2/1993 | Motonami | 437/52 |
| 5,217,914 | 6/1993 | Matsumoto et al. | 437/47 |
| 5,218,219 | 6/1993 | Ajika et al. | 257/309 |
| 5,244,824 | 9/1993 | Sivan | 437/52 |
| 5,274,258 | 12/1993 | Ahn | 257/308 |
| 5,309,393 | 5/1994 | Sakata et al. | 365/149 |

OTHER PUBLICATIONS

"3–Dimensional Stacked Capacitor for 16M and 64M DRAMS", Ema et al., International Electron Devices Meeting, Dec., 1988, pp. 592–595.

"Novel High Density, Stacked Capacitor MOS RAM", Koyanagi et al., International Electron Devices Meeting, Dec., 1978, pp. 348–351.

Kaga, et al., *Crown–Shaped Stacked–Capacitor Cell for 1.5–V Operation 64–M DRAM's*, IEEE Transactions On Electron Devices, vol. 38, No. 2, Feb. 1991, pp. 255–261.

*Primary Examiner*—Bot L. Ledynh
*Attorney, Agent, or Firm*—Lawrence J. Bassuk; Brian C. McCormack; Richard L. Donaldson

[57] ABSTRACT

A method for forming a storage capacitor (12) including the step of forming a storage node contact window (38) and forming a cavity (48) in the storage electrode (50) such that the capacitive area includes the sidewalls of the storage electrode and the cavity in the storage electrode. The capacitor is completed by forming a dielectric layer (54) over the storage electrode (50) and forming a conductive layer (56) over the dielectric layer (54) to act as a plate electrode capacitively-coupled to the storage electrode (50) through the dielectric layer (54). Other devices, systems and methods are also disclosed.

2 Claims, 3 Drawing Sheets

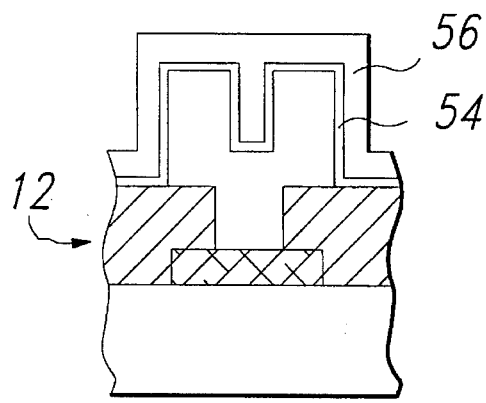
Fig. 2g
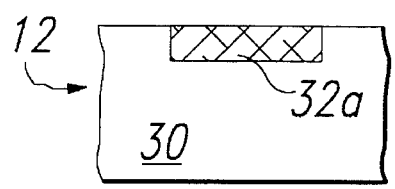
Fig. 3a
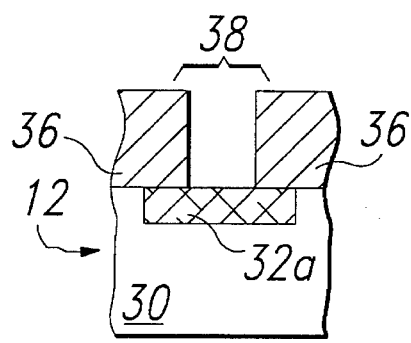
Fig. 3b
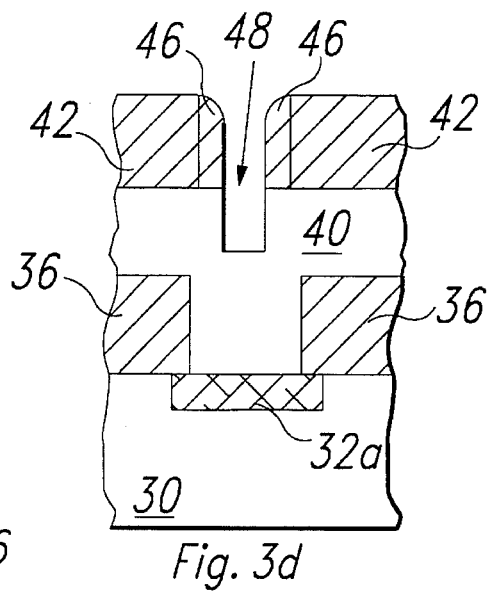
Fig. 3d
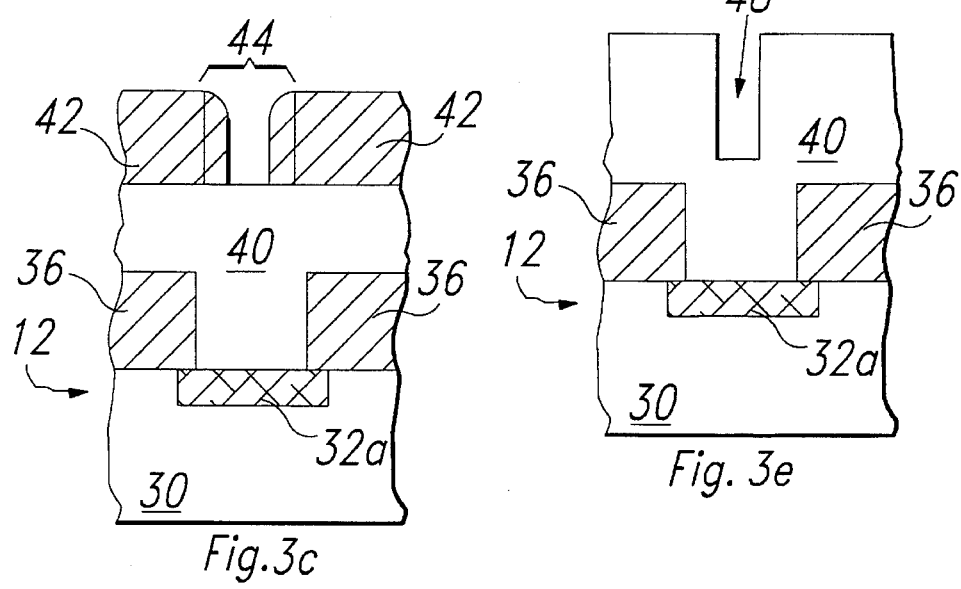
Fig. 3c
Fig. 3e

INTERMEDIATE STRUCTURE FOR FORMING A STORAGE CAPACITOR

This is a continuation of application Ser. No. 07/941,484 filed Sep. 8, 1992, now abandoned.

FIELD OF THE INVENTION

This invention generally relates to capacitors for semiconductor memory devices in general and more specifically to an increased capacitance memory cell capacitor and method of manufacture.

BACKGROUND OF THE INVENTION

Without limiting the scope of the invention, its background is described in connection with a dynamic random access memory (DRAM), as an example.

Heretofore, in this field, DRAM memory cells have used planar capacitors for simplicity of manufacturing. As the capacity of devices using these cells has increased, the geometry of these memory cells has steadily decreased until planar structures have become difficult to use reliably. As the memory cell geometry has decreased, so has the capacitor size and storage capacitance. However, a decrease in storage capacitance leads to lowered signal-to-noise ratios and errors due to alpha particle hits.

Prior art attempts to overcome these problems have included trench capacitor cells in which a capacitor is formed in the sidewall of a trench formed in a semiconductor substrate. This structure also has associated difficulties in the process of forming deep, small feature trenches.

Another prior art capacitor cell is disclosed in a U.S. Pat. No. 4,742,018 by Kimura, et al. In accordance with the claims of this invention, a process for producing a DRAM cell having a stacked capacitor is disclosed. In the process disclosed therein, a MOSFET is formed having a gate electrode, a drain region, and a source region in a semiconductor substrate. The process further comprises the steps of forming a first conductor layer on the substrate electrically connected to the drain region and depositing a first insulator film on the first conductor layer except for a necessary portion. Further disclosed therein is the step of depositing a second conductor on the first insulator so that the second conductor layer is electrically connected to the first conductor layer. Subsequently, a portion of the second conductor is removed, except for a necessary portion. The first insulator is then removed and a second insulator film is formed on the first and second conductor layers. Finally, a third conductor layer is formed on said second insulator film.

Yet another prior art capacitor cell is disclosed in an article in International Electronic Devices Meeting, 1988, pp. 592–595 by Ema, et al. In this article, Ema, et al., disclose a stacked memory cell in which the capacitor cell is three-dimension. This prior art stacked capacitor is composed of a poly-Si—$Si_3N_4$—poly-Si structure. A difficulty with this prior art capacitor cell, as well as in others including the Kimura et al. embodiment relates to the minimum spacing between capacitor cells. In these known prior art embodiments the minimum spacing between capacitor cells can be no less than the minimum feature size of the lithographic process used. A further difficulty in the prior art stacked capacitors relate to the difficult "fin" type topography which adds difficult in etching material and conformably depositing material underneath the capacitor electrode fins.

SUMMARY OF THE INVENTION

The stacked capacitor structures provided herein possess a high capacitance, high density semiconductor structure which can be manufactured without the associated difficulties of trench capacitor structures while providing improved capacitance for a minimum feature lithography, improved topography, and reduced masking process steps relative to prior known stacked capacitor structures and methods.

A method of forming a microelectronic device is disclosed comprising the steps of providing a substrate, forming a conductive region at the substrate, and forming an insulating layer on the conductive region and the substrate. The method further comprises the steps of removing selective portions of the insulating layer to expose a selective area of the conductive region thereby forming a storage node contact window and forming a first conductive layer on the insulating layer and within the storage node contact window wherein the first conductive layer is in electrical communication with the conductive region. Next a cavity is formed in the first conductive layer, the cavity being vertically disposed above the storage node contact window. Subsequently, selected portions of the first conductive layer are removed leaving at least a remaining portion of the first conductive layer in which the cavity is formed thereby isolating the remaining portion of the first conductive layer from surrounding circuit elements and forming a cup-shaped storage electrode. The capacitor is completed by forming a dielectric layer over the storage electrode and forming a second conductive layer over the dielectric layer to act as a plate electrode capacitively-coupled to the storage electrode through the dielectric layer. Therefore, for a given minimum feature size, a larger storage electrode and hence capacitance may be effected.

BRIEF DESCRIPTION OF THE DRAWINGS

In the drawings:

FIGS. 2a–2g, in partial cross section, illustrate progressive steps in the formation of a preferred embodiment microelectronic device in accordance with the preferred embodiment of the present invention; and FIGS. 3a–3g, in partial cross section, illustrate progressive steps in the formation of another preferred embodiment microelectronic device in accordance with the present invention.

Corresponding numerals and symbols in the different figures refer to corresponding parts unless otherwise indicated.

DETAILED DESCRIPTION OF PREFERRED EMBODIMENTS

Figure 1:
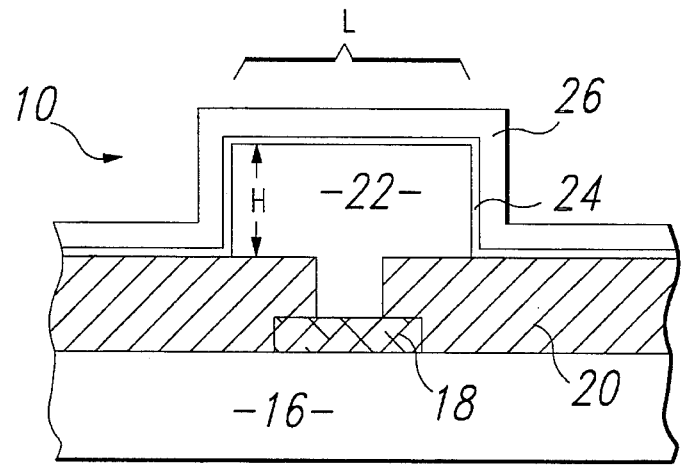
FIG. 1, in partial cross section, illustrates a microelectronic device formed in accordance with the prior art.

Referring now to the drawings in general and FIG. 1 in particular, the method of manufacturing prior art device 10 will be described. FIG. 1 shows, in partial cross section, a microelectronic circuit capacitor formed in accordance with the prior art. In the prior art, a substrate 16 is typically provided. This substrate 16 is typically formed of a monocrystalline silicon wafer. A contact pad 18 is now formed. This contact pad 18 may be polysilicon deposited on the substrate 16, or may be implanted into the substrate 16. Either method, or others, is well known in the art of semiconductor manufacturing. An insulating layer 20 is now formed over the substrate and over the contact pad 18.

Insulating layer 20 is then typically patterned to remove insulating layer 20 in areas overlying the first electrode 18. A first electrode 22 is now formed over the exposed contact pad 18. The first electrode 22 is typically heavily doped polycrystalline silicon. A very thin dielectric 24 is now deposited over the surface of the first electrode 22. This dielectric 24 is made as thin as possible for maximum capacitance. The lower limit on dielectric thickness 24 will be determined by producibility and reliability concerns. Typically dielectric 24 will be an oxide/nitride/oxide (ONO) sandwich. A second electrode 26 is now formed over the dielectric 24. The second electrode 26 is typically heavily doped polycrystalline silicon. The second electrode 26 is typically a plate electrode which is common to all capacitor elements and connected to a single potential.

Figures 2A, 2B:
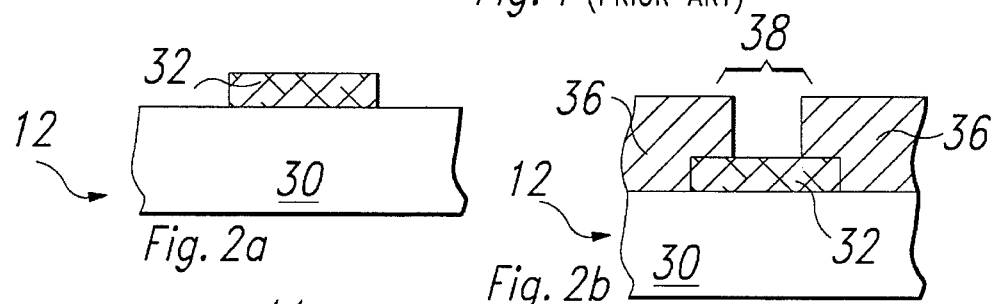

Referring now to FIGS. 2a–2g in general, the method of manufacturing the preferred embodiment of the present invention will now be described. A preferred embodiment microelectronic device 12 is shown in FIG. 2a after a first stage in manufacturing. The microelectronic device 12 comprises a substrate 30 upon which pad electrodes 32 are formed. Typically this substrate 30 is monocrystalline silicon, although other materials could be used. By way of example, substrate 30 could be formed from, but not limited to, a list of materials including crystalline silicon, non-crystalline silicon, gallium arsenide, aluminum gallium arsenide, silicon-on-sapphire, and indium phosphide. Preferably, pad electrode 32 is a layer of polysilicon deposited, patterned, and etched over the substrate 30 or is formed by selective dopant implantation into the substrate 30 (shown in FIGS. 3a–3g). Other possible compositions or methods for forming pad electrode 32 include a metal deposition of one of many metals known in the art of semiconductor manufacturing such as aluminum, titanium, gold or tungsten, or metal deposition of a number of metal alloys well known in the art.

Referring now to FIG. 2b, an insulating layer, or interlevel oxide (ILO) 36 is formed overlying the microelectronic device 12 as was formed above in FIG. 2a. This ILO 36 serves to electronically insulate the substrate 30 and pad electrode 32 from undesired electrical contact to subsequently formed semiconductor elements. Typically ILO 36 is an oxide of thickness approximately 2000 Å to 8000 Å, however, the thickness is not critical and is determined by manufacturing considerations such as dielectric integrity, surface planarity, and time required to etch contacts to the substrate 30 or pad electrode 32. As an alternative to an oxide insulating layer or ILO 36, the insulating layer may be formed of a nitride. Example insulating layers 30 include, but are not limited to: silicon dioxide and silicon nitride. A contact window 38 is now formed in ILO 36 by a process well known in the art for selectively removing a semiconductor insulating layer. Typically, by depositing a photoresist over the ILO 36, patterning the photoresist using a mask to remain everywhere except over the area which the contact window 38 is desired, and using an anisotropic etch which removes the insulating layer but to which the photoresist layer is impervious.

Figures 2C, 2D:
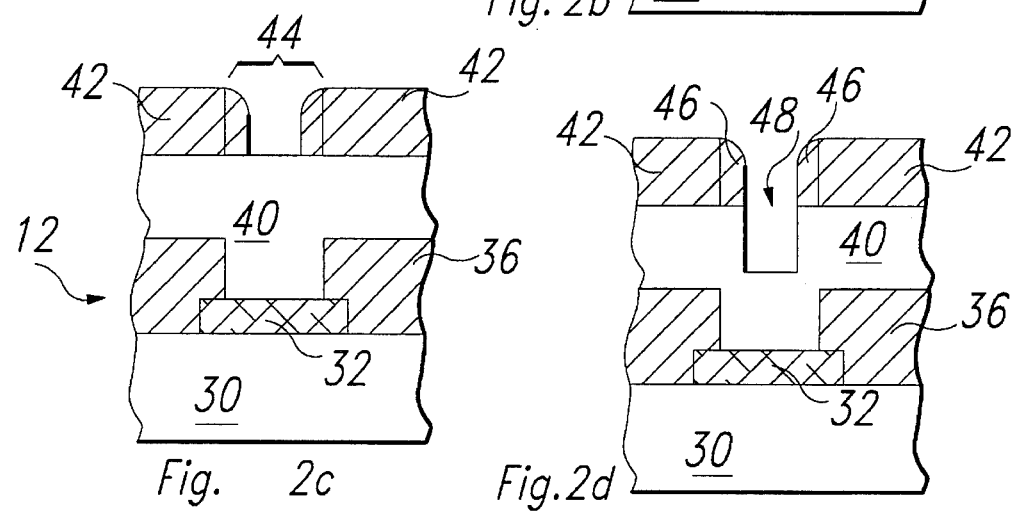

The partial cross section of microelectronic device 12 illustrated in FIG. 2c shows the structure of device 12 after a third processing stage. At this stage, a storage conductive layer 40, preferably highly doped polysilicon, is formed to a selected height, H, over the entirety of microelectronic device 12 as it existed subsequent to the processing of FIG. 2b. Preferably the thickness of conductive layer 40 is 0.5 μm. Next, a masking layer 42, preferably an oxide, is formed over the conductive layer 40. A window 44 is now formed in oxide layer 42 by a method well known in the art. Preferably this window 44 might have a typical dimension of 0.4 μm×1.0 μm for a typical cell size of 0.8 μm×1.6 μm which might be used, for example, in a 64 Mbit DRAM. The window 44 is preferably centered above the pad electrode 32. Now, masking spacers 46 are deposited with a thickness of about 0.1 μm on the sidewalls of the window 44 to decrease the size of the opening by about 0.1 μm on all sides to a selected width $W_1$ by a selected length $L_1$ (not shown). These masking spacers 46 serve the purpose of being able to reduce the size of the opening to below minimum lithographic tolerances. The spacers are formed by depositing a spacer masking layer (not shown) over oxide layer 42 having approximately the desired thickness (i.e. approximately 0.1 μm) and anisotropically etching about 0.1 μm of the spacer masking layer such as an oxide. Because of the nature of the topography, a greater thickness of the masking layer will be formed on the sidewalls of the window 44, such that the masking spacers 46 will remain on the sidewalls of the window 44.

FIG. 2d illustrates the preferred embodiment microelectronic device 12 after a fourth processing stage. In this figure, a cavity 48 is etched to a certain depth, $H_1$, preferably approximately 0.4 μm, using the masking window 44. The dimensions now of cavity 48 are $L_1 \times H_1 \times W_1$ ($L_1$ not shown).

Figures 2E, 2F:
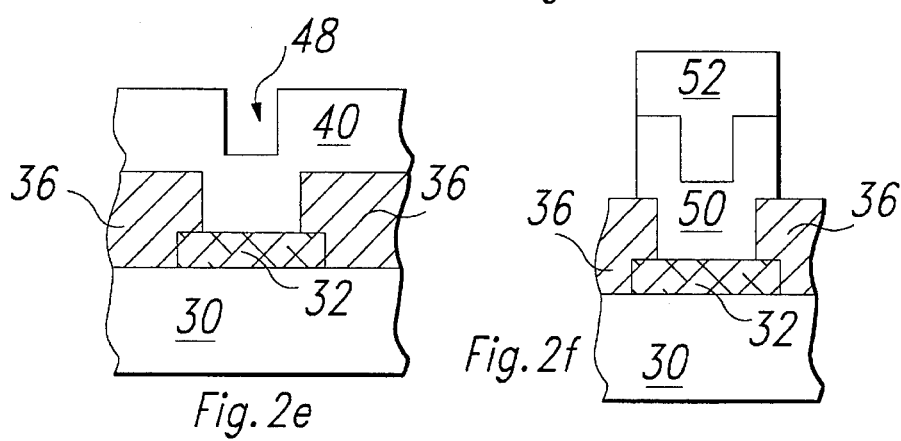
Figure 3F:
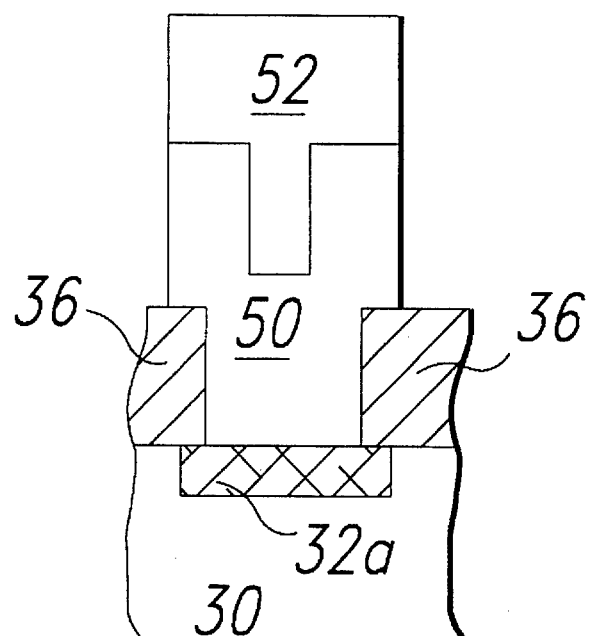
Figure 3G:
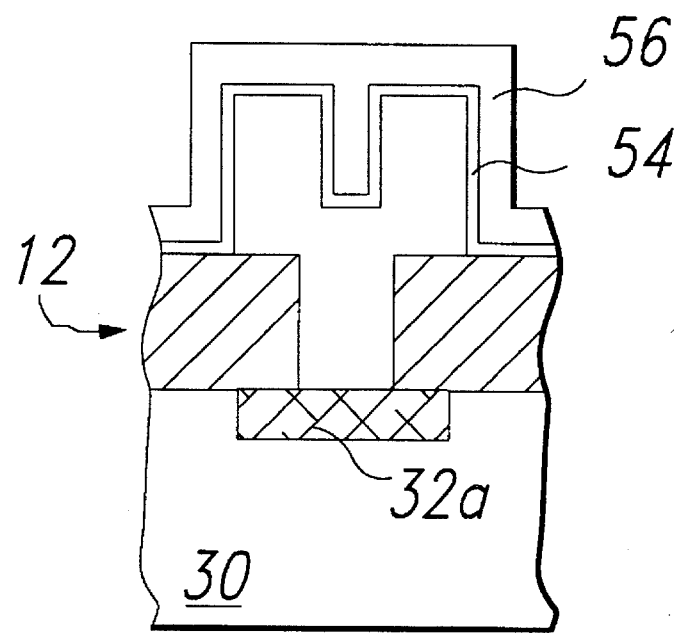

With reference to FIG. 2e, the masking materials 42,46 are now stripped away, leaving the storage conductor 40 exposed. Typically masking materials 42,46 are oxides and may be removed by a hydrogen fluoride (HF) isotropic wet etch that is selective to oxide over the storage conductor 40.

Referring now to FIG. 2f, a cup-shaped storage electrode 50 is formed from storage conductor 40 by depositing and patterning a photoresist pattern 52 in areas where the storage electrode 50 is desired and then etching away selected portions of the storage conductor 40 using an etch which is highly selective to the storage conductor 40 over the photoresist pattern 52. Preferably, the storage electrode 50 is centered about the cavity 48 which is, in turn, centered about the pad electrode 32. Storage electrode 50 is patterned to have a selected width, W, and a selected length, L, which must be greater than $W_1$ and $L_1$, respectively by twice the selected wall thickness.

With reference to FIG. 2g, the photoresist pattern 52 has been stripped away, leaving the storage electrode 50 and surrounding ILO 36 exposed. Now, a capacitor dielectric 54 is deposited over storage electrode 50 and typically may also be deposited over ILO 36 without deleterious effect. This capacitor dielectric is typically an Oxide/Nitride/Oxide (O/N/O) tri-layer, but might be an oxide, a nitride, a bi-layer thereof, or tantalum pentoxide, or some other single or composite layer which is typically characterized by a high dielectric constant. The dielectric layer 54 is ideally quite thin in order to maximize the capacitance which will be formed between the underlying storage electrode 50 and a subsequently deposited plate electrode 56. With further reference to FIG. 2g, a plate electrode 56 is deposited over the capacitor dielectric 54 to complete a storage capacitor. By forming a cup within the storage capacitor the surface area of the capacitor formed in the interface between plate electrode 56, capacitor dielectric 54, and storage electrode 50 can be increased for a given lithographic feature size and topography over prior art integrated circuit capacitors. Specifically, if the minimum lithographic feature size is limited to W×L (where W & L are the devices' horizontal features) for both the prior art and for an embodiment of the invention, and if the maximum feature height in both instances is H, then the inventive concept allows an increase in capacitor area of $2 \times (L_1 \times H_1) + 2 \times (W_1 \times H_1)$.

Preferably, substrate 30 is monocrystalline silicon, although other materials could be used. By way of example, substrate 30 could be formed from, but not limited to, a list of materials including crystalline silicon, non-crystalline silicon, gallium arsenide, aluminum gallium arsenide, silicon-on-sapphire, and indium phosphide. Preferably, pad electrode 32 is a layer of polysilicon deposited, patterned, and etched over the substrate 30. Other possible compositions or methods for forming pad electrode 32 include selective dopant implantation into the substrate 30, or metal deposition of one of many metals known in the art of semiconductor manufacturing such as aluminum, titanium, gold or tungsten, or metal deposition of a number of metal alloys well known in the art.

Preferably, ILO 36 is an oxide, but other materials could be used. By way of example, ILO 36 could be formed from, but not limited to, a list of materials including phosphosilicate glass (PSG), borophophosilicate glass (BPSG), silicon nitride, and silicon dioxide.

Storage conductive layer 40 is ideally highly doped polycrystalline silicon, but a number of other conductive materials well known in the art might be used. Masking materials 42,46 are typically oxides, but a number of other masking materials may also be used.

Dielectric layer 54 is preferably an oxide/nitride/oxide tri-layer, but might be another oxide compound such as silicon dioxide or nitride compound such as silicon nitride. Another alternative dielectric layer is tantalum pentoxide.

Plate electrode 56 is typically highly doped polysilicon. Other potential materials include, but are not limited to: a silicide such as silicided polysilicon, tungsten silicide, molybdenum silicide, or titanium-tungsten silicide; a metal such as aluminum, an aluminum-tungsten bi-layer, tungsten or gold.

Possible etching processes include wet chemical, electrochemical, pure plasma etching, reactive ion etching (RIE), ion beam milling, sputtering and high-temperature vapor etching. Possible deposition process include sputter deposition, evaporation, ion beam deposition, chemical vapor deposition, plasma-enhanced chemical vapor deposition, and spin-on glass deposition.

FIGS. 3a–3g illustrate another embodiment of the invention wherein pad electrode 32a is formed by selective dopant implantation. The remaining steps for forming the device are substantially the same as described above with respect to FIGS. 2a–2g.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An intermediate structure for forming a microelectronic device, said intermediate structure comprising:

a) a substrate including a conductive region;

b) an insulating layer overlying said substrate, said insulating layer having a storage node contact window overlying a selected area of said conductive region;

c) a conductive layer overlying said insulating layer;

d) a masking layer having a window defined therein, said window approximately above said conductive region of said substrate, said masking layer operable to prevent the etching of said conductive layer from areas underlying said masking layer such that a cavity may be defined in said conductive layer whereby a storage electrode having a cavity may be formed, wherein said window in said masking layer has a dimension that is less than a minimum lithographic feature.

2. The intermediate structure of claim 1 wherein said dimension that is less than a minimum lithographic feature is formed by defining an original window in said masking layer and by depositing a masking spacer about the perimeter of said original window.

* * * * *